United States Patent
Park

(10) Patent No.: US 9,030,884 B2
(45) Date of Patent: May 12, 2015

(54) METHOD AND APPARATUS FOR PRE-CHARGING DATA LINES IN A MEMORY CELL ARRAY

(75) Inventor: Jae-Kwan Park, Cupertino, CA (US)

(73) Assignee: Micron Technology, Inc., Boise, ID (US)

(*) Notice: Subject to any disclaimer, the term of this patent is extended or adjusted under 35 U.S.C. 154(b) by 263 days.

(21) Appl. No.: 13/081,260

(22) Filed: Apr. 6, 2011

(65) Prior Publication Data

US 2012/0257457 A1    Oct. 11, 2012

(51) Int. Cl.
G11C 11/34    (2006.01)
G11C 7/12     (2006.01)
G11C 16/06    (2006.01)
G11C 16/28    (2006.01)

(52) U.S. Cl.
CPC G11C 7/12 (2013.01); G11C 16/06 (2013.01); G11C 16/28 (2013.01)

(58) Field of Classification Search
USPC .................................................. 365/185.25
See application file for complete search history.

(56) References Cited

U.S. PATENT DOCUMENTS

| | | | | |
|---|---|---|---|---|
| 6,741,505 B2 * | 5/2004 | Yokozeki | | 365/189.15 |
| 7,688,648 B2 | 3/2010 | Kim | | |
| 7,830,705 B2 | 11/2010 | Jeong | | |
| 8,022,899 B2 * | 9/2011 | Takahara | | 345/76 |
| 2003/0063493 A1 * | 4/2003 | Yokozeki | | 365/189.07 |
| 2005/0232042 A1 * | 10/2005 | Kim et al. | | 365/203 |
| 2006/0044907 A1 * | 3/2006 | Forbes et al. | | 365/207 |
| 2007/0109895 A1 * | 5/2007 | Tokito | | 365/210 |
| 2010/0067299 A1 | 3/2010 | Futatsuyama | | |
| 2010/0149895 A1 | 6/2010 | Kim | | |
| 2010/0232229 A1 | 9/2010 | Ogawa et al. | | |
| 2012/0257457 A1 * | 10/2012 | Park | | 365/185.25 |
| 2014/0028649 A1 * | 1/2014 | Kim et al. | | 345/212 |

* cited by examiner

*Primary Examiner* — Hoai V Ho
*Assistant Examiner* — Pablo Huerta
(74) *Attorney, Agent, or Firm* — Dorsey & Whitney LLP

(57) ABSTRACT

Memories, pre-charge circuits, and methods for pre-charging memory are described. One such method includes providing a voltage to a data line and adjusting the voltage provided to the data line based at least in part on a voltage difference between a target voltage and a voltage of the data line being pre-charged. An example pre-charge circuit includes a voltage generator configured to generate an output voltage having a magnitude based at least in part on a reference voltage and a feedback signal, first and second drivers, and a voltage detector. The voltage detector is configured to determine a voltage difference between the reference voltage and a sample voltage of a data line coupled to the second driver and generate the feedback signal based at least in part on the difference.

28 Claims, 4 Drawing Sheets

METHOD AND APPARATUS FOR PRE-CHARGING DATA LINES IN A MEMORY CELL ARRAY

TECHNICAL FIELD

Embodiments of the present invention relate generally to semiconductor memory, and more particularly in one or more of the illustrated embodiments, to semiconductor memory utilizing a technique for increasing the speed capability and storage capacity of the memory.

BACKGROUND OF THE INVENTION

Associated with the rapid progress of semiconductor integration circuit techniques and the development of a higher integration of semiconductor elements, a technological revolution for a semiconductor memory devices has been in progress with the aim of gaining larger capacity and further miniaturization.

A data read operation performed in a memory device requires pre-charging the data lines, which are commonly referred to in conventional flash devices as "bit lines" (in light of this convention, the term "bit lines" will be used hereinafter in the examples). The reason is that, to confirm whether a memory cell is in an erase state "1" or program state "0", a verification of a change in potential is difficult unless the bit line is provided with a certain level of potential. A common practice is to apply a pre-charge voltage to increase the voltage of the bit line to a predetermined value in advance, followed by detecting a change in the voltage of the bit line when the bit line is applied to a memory cell by comparing the voltage of the bit line with the pre-charge voltage used as a reference.

One recent problem accompanying a large capacity memory (on the order of gigabytes) is the extension of the length of bit lines. This causes the resistance value R of the bit line to increase and the parasitic capacitance C between the bit lines to increase, thus increasing a time constant RC of the bit lines. An increase in the time constant RC results in increasing the time period required to drive the bit lines to a voltage, for example, to a pre-charge voltage. Because pre-charging of bit lines is performed for most memory access operations, and increase in the time to pre-charge bit lines may be significant and have a negative effect on memory performance.

DETAILED DESCRIPTION

In the following description, certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
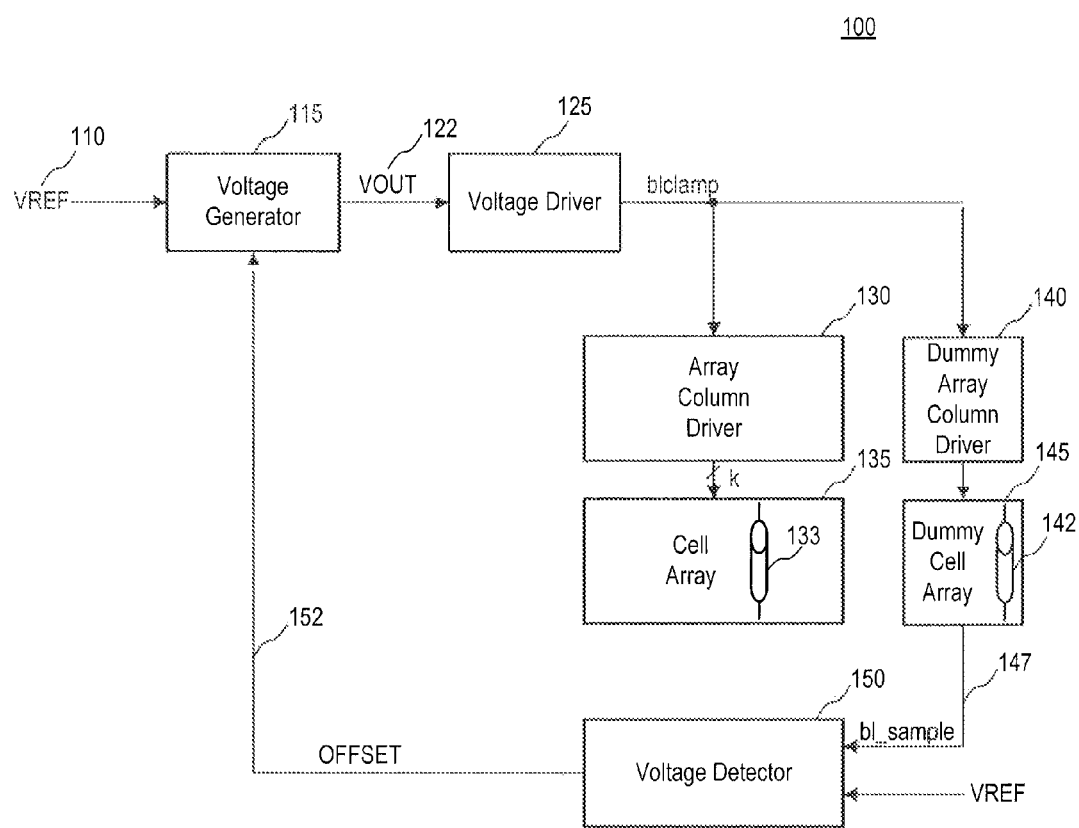
FIG. 1 is a simplified functional block diagram of a bit line pre-charge circuit according to an embodiment of the present invention.

FIG. 1 illustrates a bit line pre-charge circuit 100 according to an embodiment of the present invention. Voltage generator 115 generates an output voltage VOUT based at least in part on a target bit line voltage VREF 110 provided to the voltage generator 115. The VOUT voltage is provided to a voltage driver 125 and is used to generate a variable clamp voltage blclamp, which may be used to couple bit lines in cell array 135 through array column driver 130 to a pre-charge voltage during pre-charge operations. The blclamp voltage is variable based at least in part on the magnitude of the VOUT voltage from the voltage generator 115. Cell array 135, for example, may have k bit lines 133. The blclamp voltage may be further provided to dummy array column driver 140 to couple the pre-charge voltage to dummy bit lines 142 in dummy cell array 145. Although the voltage driver 125 is illustrated in FIG. 1 as a separate functional block, in some embodiments it may be included in the voltage generator 115 or the array column driver 130 and the dummy column driver 140.

In various embodiments of the present invention, the dummy column driver 140, dummy bit line 142, and dummy cell array 145 may be designed such that dummy bit line 142 reproduces the parasitic RC characteristic of bit lines 133. In one embodiment, dummy column driver 140, dummy bit line 142, and dummy cell array 145 may be the same circuit and interconnect design as array column driver 130, bit lines 133, and cell array 135. In another embodiment, dummy column driver 140, dummy bit line 142, and dummy cell array 145 may be the same design with a different shape or layout (e.g, to save die area). In further embodiments of the present invention, dummy column driver 140, dummy bit line 142, and dummy cell array 145 may be repeated (i.e., reproduced or copied) multiple times throughout the memory die. As readily understood to one of ordinary skill in the art, dummy column driver 140, dummy bit line 142, and dummy cell array 145 may comprise any equivalent network such that dummy bit line 142 has the same parasitic resistance and capacitance as bit lines 133 in cell array 135. Other combinations and permutations are possible. For example, depending upon the layout and size of the memory die, there will be a different number of total number of dummy bit lines 142 and different ratios of dummy bit lines 142 to bit lines 133.

A voltage detector 150 is coupled to at least some bit lines 142 of the dummy cell array 145 to receive a bit line sample voltage bl_sample. The voltage detector 150 further receives the VREF voltage and is configured to detect a difference between the bl_sample voltage and the VREF voltage and provide an output signal OFFSET based at least in part on the difference. The OFFSET signal is provided to the voltage generator 115. The bl_sample voltage may be taken from various points along the bit lines 142, for example, at an end node which is the point on the bit line 142 furthest from dummy array column driver 140.

As will be described in more detail below, the voltage generator 115 may adjust the magnitude of the VOUT voltage (and thereby variably adjust the voltage of the blclamp voltage provided to the array column driver 130 and the dummy array column driver 140) based at least in part on the OFFSET signal, for example, so that the bl_sample voltage is closer in magnitude to the VREF voltage. For example, as different memory cells along the length of bit lines 133 in cell array 135 are accessed, the parasitic RC characteristic of bit lines 133 change. By adjusting the VOUT voltage and providing an adjusted blclamp voltage to the array column driver 130, the parasitic RC delay effects of the bit lines 133 of the cell array 135 may be compensated. That is, because the dummy array column driver 140 and the dummy cell array 145 models the array column driver 130 and the cell array 135, respectively, and the dummy bit lines 142 model the parasitic RC characteristic of bit lines 133, the adjusted blclamp voltage (also provided to the array column driver 130) based on the difference between VREF and the bl_sample voltage may compensate for the effects on the bit lines 133, as modeled by bit line 142.

Figure 2:
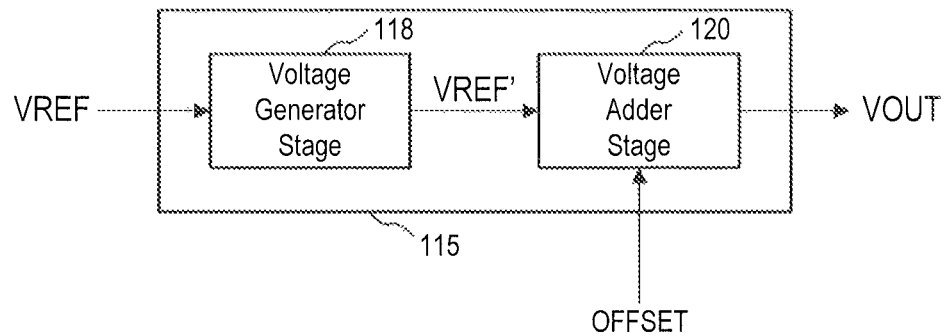
FIG. 2 is a simplified functional block diagram of a voltage generator according to an embodiment of the present invention for the bit line pre-charge circuit of FIG. 1.

FIG. 2 illustrates a voltage generator 115 according to an embodiment of the present invention. The voltage generator 115 includes a voltage generator stage 118 and a voltage adder stage 120. The voltage generator stage 118 receives the VREF voltage and generates a VREF' voltage which is provided to the voltage adder stage 120. Based on the OFFSET signal, the voltage adder stage 120 provides a voltage that is summed with the VREF' voltage to provide the VOUT voltage. As a result, the VOUT voltage may be adjusted based on the OFFSET signal, for example, to compensate for a voltage difference between the VREF voltage and a bl_sample voltage indicative of a bit line voltage of a dummy bit line.

Figure 3:
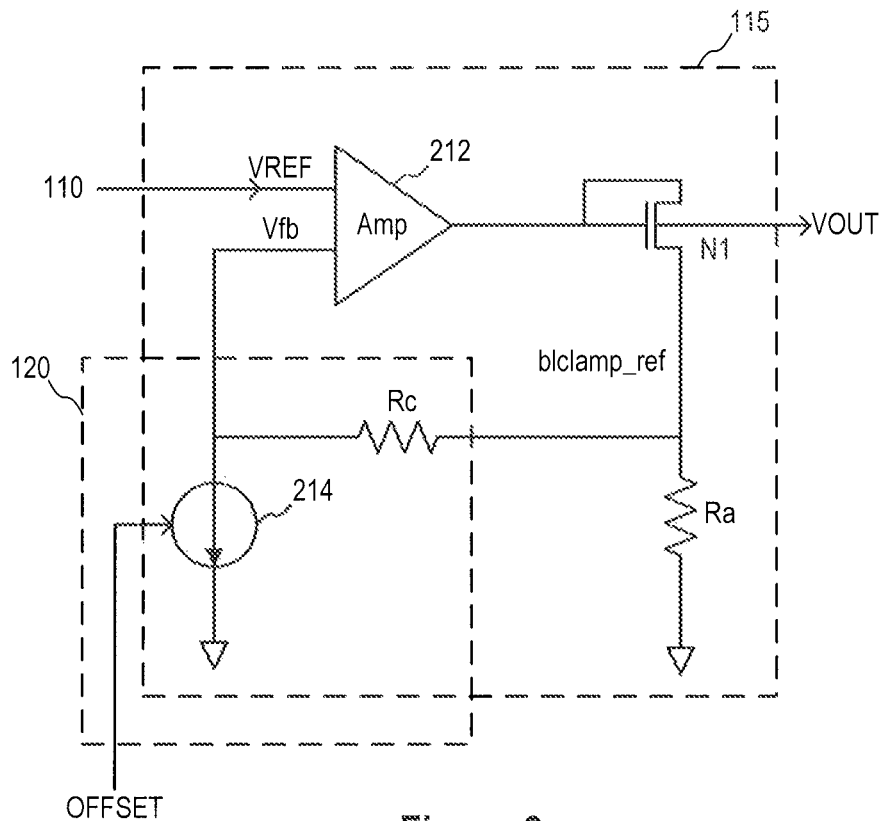
FIG. 3 is a simplified schematic diagram of a voltage generator according to an embodiment of the present invention for the bit line pre-charge circuit of FIG. 1.

FIG. 3 illustrates a voltage generator 115 according to another embodiment of the present invention. In voltage generator 115, differential amplifier 212 receives target bit line voltage VREF 110 and a feedback voltage Vfb from voltage adder 120. Differential amplifier 212 may be a circuit that multiplies the difference between two inputs by a constant factor called the gain (e.g., operational amplifier or op-amp). The output of differential amplifier 212 is coupled to transistor N1 configured as a diode. The voltage adder 120 is coupled to transistor N1 and provides the Vfb voltage to the differential amplifier 212 having a magnitude based at least in part on the OFFSET signal. The OFFSET signal adjusts a current provided by current source 214 to change the Vfb voltage, thereby adjusting the VOUT voltage based at least in part on the OFFSET signal. The magnitude of the Vfb voltage is Vfb =VREF +VRc, where VRc is dependent on the current provided by the current source 214. The magnitude of the VOUT voltage is VOUT=VREF+VRc+Vgs,N1. Vgs,N1 is the gate-source voltage of transistor N1 when Ids,N1 =Idn, where Ids,N1 is the current flowing through the drain and source of transistor N1, and Idn=VREF/Ra. The VRc component, as previously discussed, is provided by voltage adder 120 and is based at least in part on the OFFSET signal.

As also previously discussed, the VOUT voltage is provided to a voltage driver, for example, voltage driver 125 which provides a clamp voltage blclamp (based on the VOUT voltage) to array column driver 130 and dummy array column driver 140.

Figure 4:
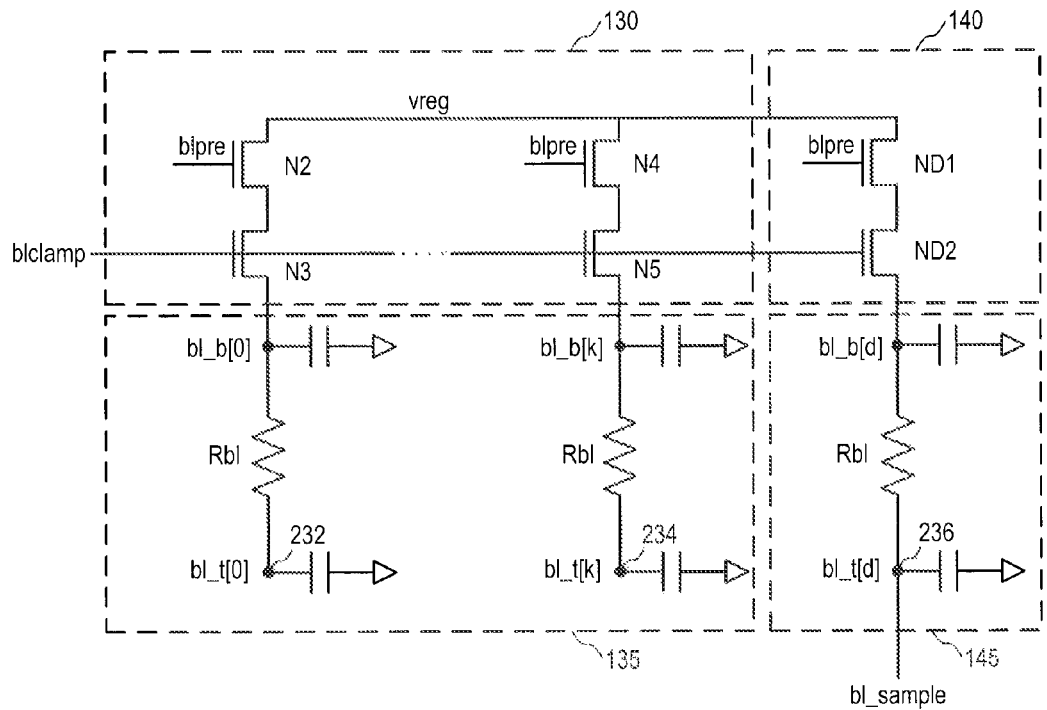
FIG. 4 is a simplified schematic diagram of a dummy array column driver and dummy cell array according to an embodiment of the present invention.

FIG. 4 illustrates a dummy array column driver 140 and a dummy cell array 145 according to an embodiment of the present invention. FIG. 4 further illustrates an array column driver 130 and cell array 135. Both the array column driver 130 and the dummy array column driver 140 receive the blclamp voltage. Array column driver 130 is comprised of two or more transistors N3 and N5 which may receive blclamp at their gates. Coupled to transistors N3 and N5 are transistors N2 and N4 which receive blpre at their gates and Vreg. The blpre signal is a conventional bit line pre-charge enable signal that activates transistors N2 and N4 during a pre-charge operation. A pre-charge voltage source Vreg provides a pre-charge voltage to the bit lines of the cell array 135 through transistors N2, N3 and N4, N5. In the embodiment illustrated in FIG. 4, the dummy array column driver 140 includes transistors N4, N5 that are similar to transistors N2, N3 and N4, N5 of the array column driver 140.

Cell array 135 comprises bit lines 232-234. Bit lines 232-234 are represented by a simplified model for parasitic RC characteristic of a (long) metal bit line. Nodes bl_b are nearest to array column driver 130 and nodes bl_t are furthest from array column driver 130. Rbl is the parasitic resistance of the bit lines. Cbl is the parasitic capacitance of the bit lines. Dummy array column driver 140 and dummy cell array 145 may be designed to replicate the parasitic RC characteristics of bit lines 232-234 of cell array 135 in bit line 236 of dummy cell array 145.

As previously discussed, by replicating the parasitic RC characteristics of bit lines 232-234 using bit line 236, a sample voltage bl_sample taken from the bit line 236 can be used to feedback voltage information to a voltage generator, for example, voltage generator 115. The voltage generator may adjust the blclamp voltage provided to the array column driver 130 and the dummy array column driver 140 based on the feedback voltage to compensate for any difference between the VREF and bl_sample voltages, and thereby compensate for any difference between the VREF voltage and the voltage of bit lines 232-234, as modeled by bit line 236. For example, in some embodiments, the transistors N3 and N5, are of the same dimensions as transistor N1 of the voltage generator of FIG. 3. In this manner, the threshold voltages Vt of transistors N1, N3, and N5 are similar. As a result, where the blclamp voltage is equal to VOUT, and VOUT=VREF+ VRc+Vgs,N1, the voltage applied by Vreg through the transistors N3 and N5 of the array column driver 130 and the transistor N5 of the dummy array column driver 140 to the bit lines 232, 234 and dummy bit line 236 is VREF+VRc, where VREF is the target bit line voltage and VRc is the added voltage from the voltage adder 120 based on the difference between VREF and bl_sample. With a higher blclamp voltage, the transistors N3 and N5 of the array column driver 130 and the transistor N5 of the dummy column driver 140 are more conductive allowing the Vreg supply to drive the bit lines harder. That is, the coupling of the Vreg to the bit lines may be based at least in part on a voltage difference between a target bit-line voltage VREF and a voltage of at least one bit line being pre-charged bl_sample.

Figure 5:
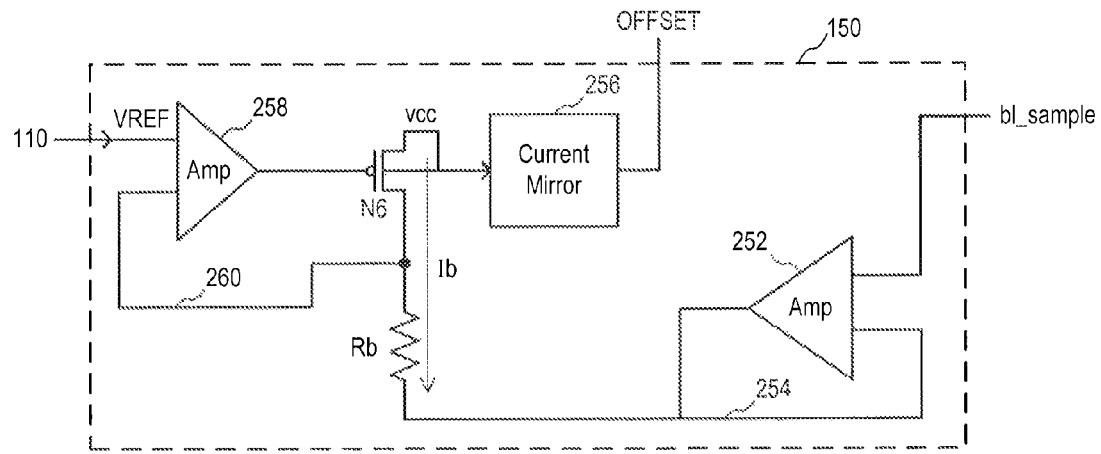
FIG. 5 is a simplified schematic diagram of a voltage detector according to an embodiment of the present invention for the bit line pre-charge circuit of FIG. 1.

FIG. 5 illustrates a voltage detector 150 according to an embodiment of the present invention. Voltage detector 150 receives bl_sample in differential amplifier 252. Differential amplifier 252 is configured as a buffer to buffer the bl_sample voltage, which is applied to a node of resistance Rb. Resistance Rb is coupled through transistor N6 to a voltage supply Vcc. Transistor N6, for example, may be a p-type field effect transistor (FET). Differential amplifier 258 is coupled to the gate of transistor N6. Differential amplifier 258 receives target bit line voltage VREF 110 and feedback 260. A current mirror 256 is coupled to receive current Ib as an input current.

In operation, the output of current mirror 256 is mirrored from the Ib current, which may be given by: Ib=Vdiff/Rb, where Vdiff=VREF−bl_sample. Accordingly, Ib is reflective of the voltage difference between VREF and bl_sample. The relationship between the Ib current and Vdiff is that the Ib current increases as the difference between the VREF and bl_sample voltages increases and the Ib current decreases as the difference between the VREF and bl_sample voltages decreases. The Ib current of the current mirror 256 is provided to voltage generator 115 as the OFFSET signal. For example, with reference to the embodiment of the voltage generator 115 illustrated by FIG. 3, the output of current mirror 256, Ib, may be received in voltage adder 120 as an input to current source 214. Current source 214 may provide a pull down current, IOFFSET, which may be given by: IOFFSET=K*Ib, where K is the number of bit lines. Current source 214 is coupled to an input of differential amplifier 212. In operation, current source 214 adds voltage which is a function of the difference between VREF and bl_sample: Vdiff=K*Ib*RC=IOFFSET*RC. So, at input Vfb of differential amplifier 212, Vfb=VREF+Vdiff. Hence, the output of voltage generator 115 may be given by: VOUT VREF Vgs, N1+Vdiff. As a result, in response to a relatively large Ib (i.e., indicating a relatively large difference between VREF and bl_sample) a relatively large voltage is added to VOUT, whereas in response to a relatively small Ib (i.e., indicating a relatively small difference between VREF and bl_sample), a relatively small voltage is added to VOUT. When Ib is zero, indicating VREF and bl_sample are equal, the voltage adder 120 does not add any voltage to VOUT.

Figure 6:
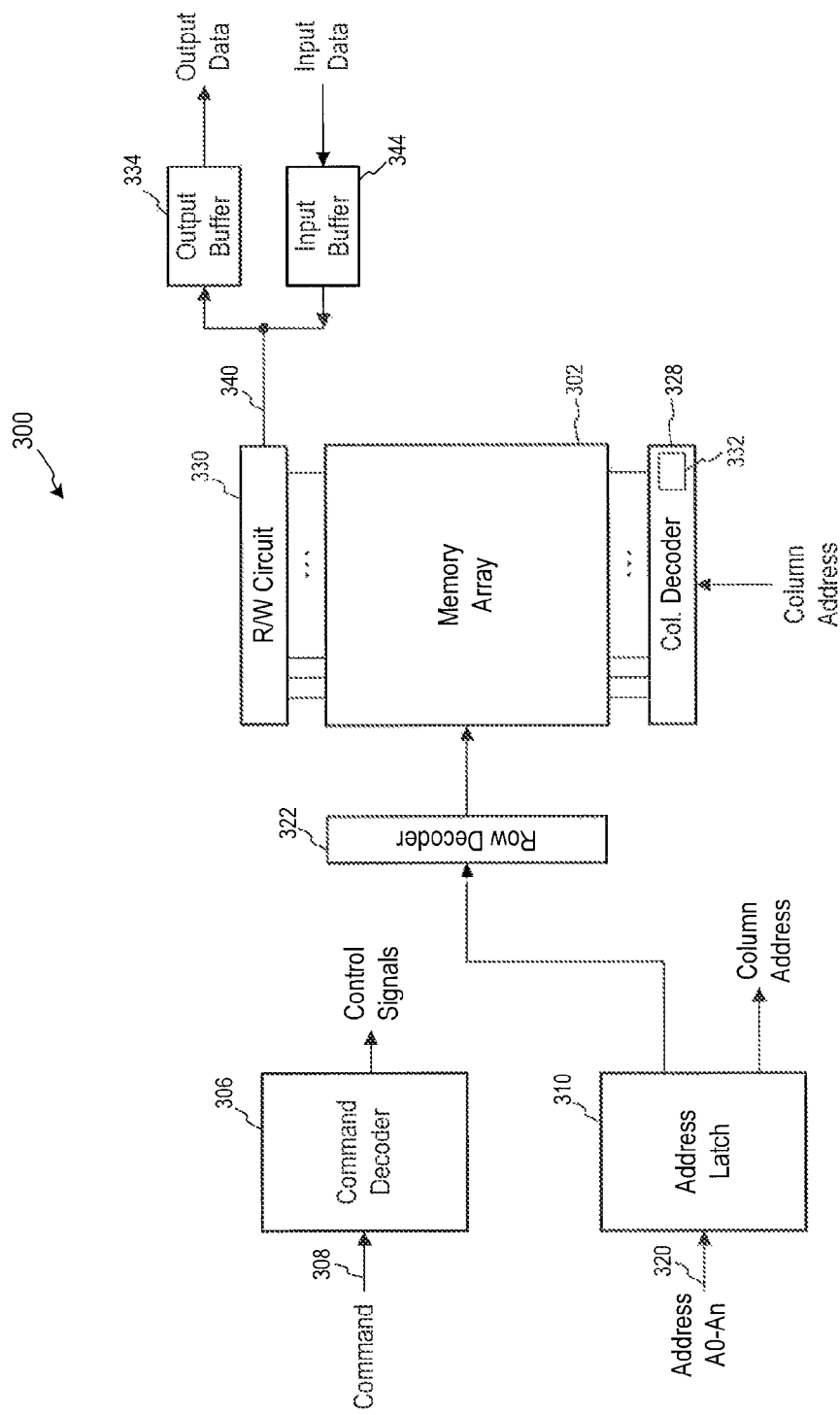
FIG. 6 is a simplified block diagram of a memory according to various embodiments of the present invention.

Due to the dynamic nature of a bit line pre-charge circuit having feedback based on the voltage of dummy bit lines modeling actual bit lines, transient response during bit line pre-charge may be improved. That is, when the bit lines are initially pre-charged, the blclamp voltage which is based on VOUT from the voltage generator 115 and applied to the array column driver 130 and the dummy array column driver 140 may be relatively high to make transistors N3 and N5 of the array column driver 130 and transistor N5 of the dummy array column driver 140 more conductive to allow greater drive from the Vreg supply. As the b_sample voltage increases to the target pre-charge voltage VREF, the blclamp voltage may be reduced to VREF+Vtn1, that is, the additional voltage provided by the voltage adder 120 reduces to zero because the difference between VREF and bl_sample becomes zero, FIG. 6 illustrates a memory according to some embodiments of the present invention. The memory 300 includes an array 302 of memory cells, which may be, for example, DRAM memory cells, SRAM memory cells, flash memory cells, or some other type of memory cells. The memory system 300 includes a command decoder 306 that receives memory commands through a command bus 308 and generates corresponding control signals within the memory system 300 to carry out various memory operations. The command decoder 306 responds to memory commands applied to the command bus 308 to perform various operations on the memory array 302. For example, the command decoder 306 is used to generate internal control signals to read data from and write data to the memory array 302. Row and column address signals are applied to the memory system 300 through an address bus 320 and provided to an address latch 310. The address latch then outputs a separate column address and a separate row address.

The row and column addresses are provided by the address latch 310 to a row address decoder 322 and a column address decoder 328, respectively. The column address decoder 328 selects bit lines extending through the array 302 corresponding to respective column addresses. The column address decoder 328 includes a bit line pre-charge circuit 332 according to an embodiment of the present invention. As previously discussed, the bit line pre-charge circuit 332 is configured to generate bit line pre-charge voltage that may be adjusted to compensate for a voltage difference between a voltage of the bit lines and a target bit line voltage. The row address decoder 322 is connected to word line driver 324 that activates respective rows of memory cells in the array 302 corresponding to received row addresses. The selected data line (e.g., a bit line or bit lines) corresponding to a received column address are coupled to a read/write circuitry 330 to provide read data to a data output buffer 334 via an input-output data bus 340. Write data are applied to the memory array 302 through a data input buffer 344 and the memory array read/write circuitry 330.

Memory systems in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. For example, the invention is not limited to a specific memory technology and may be applied to several different memory technologies, such as non-volatile memories (e.g., NOR-type flash) and volatile memories (e.g., dynamic random access memory (DRAM), including double data rate (DDR) synchronous dynamic random access memory (SDRAM). As another example, instead of using current Ib in voltage detector 150 and voltage adder 120, a voltage may be generated, and Vdiff used directly or Vdiff derived/generated. Accordingly, the invention is not limited except as by the appended claims.

What is claimed is:

1. A pre-charge circuit for a memory, the pre-charge circuit comprising:
    a voltage generator configured to generate an output voltage having a magnitude based at least in part on a reference voltage and a feedback signal;
    a first driver configured to pre-charge a first data line responsive to the output voltage from the voltage generator with a drive based on the magnitude of the output voltage;
    a second driver configured to pre-charge a second data line responsive to the output voltage from the voltage generator and with a drive based on the magnitude of the output voltage, the second data line configured to exhibit electrical characteristics substantially the same as electrical characteristics of the first data line; and
    a voltage detector configured to determine a voltage difference between the reference voltage and a sample voltage of the second data line and generate the feedback signal based at least in part on the difference.

2. The pre-charge circuit of claim 1 wherein the electrical characteristics include a resistance-capacitance characteristic.

3. The pre-charge circuit of claim 1 wherein the feedback signal comprises a current signal.

4. The pre-charge circuit of claim 1 wherein the second driver and the first driver have substantially the same configuration.

5. The pre-charge circuit of claim 1, further comprising a plurality of memory cells coupled to the first data line.

6. The pre-charge circuit of claim 1 wherein the voltage detector is coupled to an end of the second line opposite of the second driver.

7. The pre-charge circuit of claim 1, further comprising a voltage driver configured to receive the output voltage and generate an output driver voltage provided to the first and second drivers.

8. The pre-charge circuit of claim 1, further comprising a voltage driver configured to receive the output voltage and generate an output driver voltage responsive thereto that is used to couple the first and second data lines to a pre-charge voltage.

9. The pie-charge circuit of claim 1 wherein the first driver and the second driver are configured to receive the output voltage and generate a voltage used to couple the first and second data lines to a pre-charge voltage during pre-charge operations.

10. A memory comprising:
a memory cell array comprising a plurality of memory cells that can be selectively coupled to a data tine;
a driver configured to pre-charge the data line to a pre-charge voltage responsive to a variable clamp voltage, wherein a drive of the driver is adjusted based on a magnitude of the variable clamp voltage; and
a voltage detector configured to determine a difference between voltage of the data line and a target data line voltage, wherein the magnitude of the variable clamp voltage is based at least in part on the difference.

11. The memory of claim 10 further comprising a dummy data line configured to exhibit substantially the same electrical characteristics as the data line in the memory cell array and the pre-charge circuit coupled to at least one dummy bit line.

12. The memory of claim 11 wherein the electrical characteristics include a resistance-capacitance characteristic.

13. The memory of claim 11 wherein the dummy data line and the data line in the memory cell array have substantially similar physical characteristics.

14. The memory of claim 10 further comprising:
a voltage generator configured to generate the clamp voltage based at least in part on the target data line voltage and a feedback signal; and
wherein the voltage detector is further configured to generate the feedback signal having a magnitude based at least in part on the difference.

15. The memory of claim 14 wherein the voltage detector is configured to generate a current feedback signal having, a magnitude based at least in part on the difference.

16. The memory of claim 10 wherein the plurality of memory cells comprise a plurality of flash memory cells.

17. A method for pre-charging a data line, comprising:
providing, a voltage to the data line, and
adjusting a drive of a driver configured to provide the voltage to the data line based at least in part on a voltage difference between a target voltage and a sample voltage of a model data line being pre-charged the voltage.

18. The method of claim 17 wherein adjusting the voltage provided to the data line comprises increasing conductivity of a coupling responsive to a voltage difference between the target voltage and the voltage of the data line being pre-charged.

19. The method of claim 17 wherein adjusting the voltage provided to the data line comprises:
determining a difference between the target voltage and the voltage of the data line being pre-charged;
generating a voltage having a magnitude equal to a sum of the target voltage and a feedback voltage, the feedback voltage based at least in part on the difference; and
adjusting the voltage provided to the data line based at least in part on the magnitude of the generated voltage.

20. The method of claim 19 wherein determining the difference between the target voltage and the voltage of the data line being pre-charged comprises sampling a voltage from a dummy data line having electrical characteristics substantially similar to electrical characteristics of other the data line being pre-charged.

21. The method of claim 19 wherein determining the difference between the target voltage and the voltage of the data line being pre-charged comprises sampling a voltage from a dummy data line having physical characteristics substantially similar to physical characteristics of the data line being pre-charged.

22. The method of claim 19 wherein generating a voltage having a magnitude equal to a sum of the target voltage and a feedback voltage comprises generating a current signal having a magnitude indicative of the difference and generating the feedback voltage based at least in part on the magnitude of the current signal.

23. A method for accessing a plurality of memory cells in an array comprising:
receiving a reference signal;
generating a feedback signal based at least in pan on driving a first signal through network configured to exhibit characteristics substantially the same as the characteristics of a plurality of data lines and indicative of the characteristics;
pre-charging at least a portion of the array with a driver having an adjustable drive that is based upon a. voltage difference between the reference signal and a feedback signal; and
accessing the array.

24. The method of claim 23 wherein the characteristics include a resistance-capacitance characteristic.

25. The method of claim 23 wherein driving a fist signal through a network comprises driving the first signal through a. network of dummy data lines having electrical characteristics substantially similar to the plurality of data lines.

26. The method of claim 23 wherein generating a feedback signal comprises driving the first signal through the network and determining a difference between a target pre-charge voltage and a voltage of a dummy data line.

27. The method of claim 23 wherein pre-charging at least a portion of the array comprises generating a voltage having, a magnitude based on a voltage difference between the reference signal and the feedback signal.

28. The method of claim 27 wherein the feedback signal is based at least in part on a sample voltage taken from a dummy data line of the array.

* * * * *

UNITED STATES PATENT AND TRADEMARK OFFICE
CERTIFICATE OF CORRECTION

PATENT NO. : 9,030,884 B2
APPLICATION NO. : 13/081260
DATED : May 12, 2015
INVENTOR(S) : Jae-Kwan Park It is certified that error appears in the above-identified patent and that said Letters Patent is hereby corrected as shown below:

IN THE CLAIMS

| | Reads | Should Read |
|---|---|---|
| Column 7, Line 6 | "The pie-charge circuit of claim 1" | --The pre-charge circuit of claim 1-- |
| Column 7, Line 13 | "coupled to a data tine" | --coupled to a data line-- |
| Column 7, Line 40 | "feedback signal having, a magnitude" | --feedback signal having a magnitude-- |
| Column 7, Line 45 | "providing, a voltage to the data line, and" | --providing a voltage to the date line; and-- |
| Column 8, Line 29 | "based at least in pan on" | --based at least in part on-- |
| Column 8, Line 36 | "based upon a. voltage difference" | --based upon a voltage difference-- |
| Column 8, Line 43 | "a. network of dummy data lines" | --a network of dummy data lines-- |

Signed and Sealed this
Sixth Day of October, 2015

Michelle K. Lee
*Director of the United States Patent and Trademark Office*